United States Patent

Daxinger

[11] 4,101,200
[45] Jul. 18, 1978

[54] COATING COMPOSITION FOR A LIGHT TRANSMITTING ABSORBING COATING ON SUBSTRATES

[75] Inventor: Helmut Daxinger, Wangs, Switzerland

[73] Assignee: Balzers Patent-und Beteiligungs-Aktiengesellschaft, Liechtenstein

[21] Appl. No.: 664,424

[22] Filed: Mar. 8, 1976

[30] Foreign Application Priority Data

Mar. 7, 1975 [CH] Switzerland ............... 3390/75

[51] Int. Cl.² ............ G02B 5/23; C23C 15/00; G02B 5/28
[52] U.S. Cl. ................................. 350/166; 350/1.7; 204/192 P; 427/167; 428/215; 428/216; 428/336; 428/428; 428/433; 428/450; 428/411
[58] Field of Search ............... 428/450, 428, 411, 215, 428/216, 336, 433; 204/192 P; 427/167; 350/166, 1

[56] References Cited

U.S. PATENT DOCUMENTS

| | | | |
|---|---|---|---|
| 2,854,349 | 9/1958 | Dreyfus | 428/428 |
| 2,964,427 | 12/1960 | Rheinberger | 428/428 |
| 3,042,542 | 7/1962 | Anders | 428/428 |
| 3,094,650 | 6/1963 | Riegert | 428/428 |
| 3,400,006 | 9/1968 | Berning | 428/428 |
| 3,567,509 | 3/1971 | Kuiper | 428/428 |
| 3,781,089 | 12/1973 | Fay | 428/450 |
| 4,045,125 | 8/1977 | Farges | 350/166 |
| 4,056,649 | 11/1977 | Walls, Jr. | 428/433 |

Primary Examiner—Ellis Robinson
Attorney, Agent, or Firm—McGlew and Tuttle

[57] ABSTRACT

A light transmitting, absorbing coating is produced on a substrate by depositing layers of silicon in an oxidizing residual gas atmosphere and chrome in a non-oxidizing residual gas atmosphere in alternate layers cathode sputtering. The light transmitting layer comprises a substrate having a coating of a bluish-grey transmission color which comprises a plurality of alternate chrome and silicon dioxide layers with the thickness of the individual chrome layers being smaller than 10 nm.

9 Claims, 1 Drawing Figure

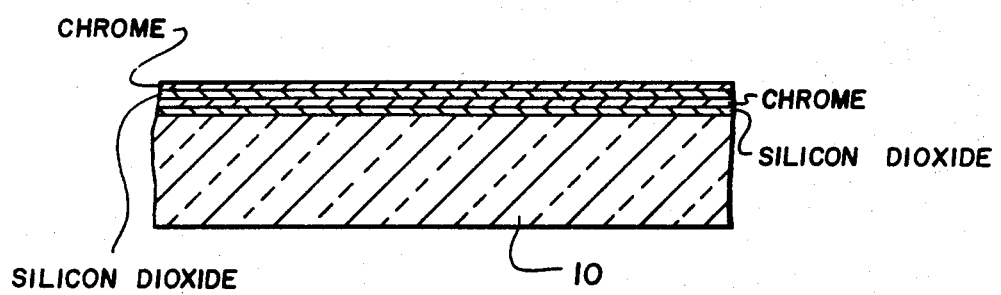

COATING COMPOSITION FOR A LIGHT TRANSMITTING ABSORBING COATING ON SUBSTRATES

FIELD AND BACKGROUND OF THE INVENTION

This invention relates in general to a construction for a coating and, in particular, to a new and useful transparent absorbing coating on substrates and to an improved light transmitting absorbing coating of bluish grey transmission coating.

DESCRIPTION OF THE PRIOR ART

The present invention relates to a light transmitting, absorbing, coating on substrates, in which alternately metallic and non-metalic layers are deposited on the substrate by cathode sputtering. The invention further relates to coatings produced in accordance with this method and which transmit a bluish grey light. Such coatings may be used, for example, for anti-dazzle glasses of any kind, such as sun glasses and sun visors for motor vehicles.

Alternate layer systems comprising a plurality of alternately metallic and non-metallic layers are well known in the art. It is also known that most of the thin metal layers of which such alternate layer systems are composed have a more or less neutral grey color. In particular, it is known that with the use of chrome layers embedded between oxide layers, brown light absorbing coatings are obtained. Many attempts have been made to produce coatings of other colors also by evaporation or cathode sputtering. For this purpose, in most cases, the applied layers are subjected to an after-treatment at higher temperatures, entailing the formation of a colloidal structure of the layers. This last-mentioned method, however, is relatively complicated and difficult to reproduce since minimum variations of the mixture ratio and of the temperatures used for the thermal treatment strongly influence the degree of coloring of the finished layer.

A further method of producing bluish layers is known in which a mixture of 30 to 40% by weight of cobalt hydroxide and 5 to 15% by weight of aluminum dioxide ($Al_2O_3$) is deposited by evaporation, in an oxidizing low-pressure atmosphere, on a substrate, and the other layers of the system comprise other oxides which, in practice, are non-absorbing within the wavelength range of the visible light. These layers must be subsequently exposed to a thermal treatment. The disadvantage of this known method is primarily the necessity of the last-mentioned step. For this purpose, in order to obtain reproducible results, expensive furnaces for the thermal treatment with an accurate control of the temperature variation must be used.

SUMMARY OF THE INVENTION

The present invention is directed to coatings transmitting bluish grey light.

In accordance with the invention, a method of applying alternately metallic and non-metallic layers by cathode sputtering on a substrate is provided in which, alternately, silicon is deposited in an oxidizing residual gas atmosphere and chrome is deposited in a non-oxidizing residual gas atmosphere. Thereby, a coating of bluish transmission color is obtained in contrast to the usual brown absorption coatings produced by evaporation of chrome. Advantageously the sputtering of chrome is effected in an argon atmosphere.

Accordingly, it is an object of the invention to provide a method of producing a light transmitting, absorbing coating on substrates, which comprises alternately depositing by sputtering silicon in an oxidizing residual gas atmosphere and chrome in a non-oxidizing residual gas atmosphere in layers.

A further object of the invention is to provide a light transmitting, absorbing coating of bluish-grey transmission color which comprises a plurality of alternate chrome and silicon dioxide layers, with the chrome layers being smaller than 10 nm.

A further object of the invention is to provide a light transmitting coating which is simple in concept and economical to effect.

The various features of novelty which characterize the invention are pointed out with particularity in the claims annexed to and forming a part of this disclosure. For a better understanding of the invention, its operating advantages and specific objects attained by its uses, reference should be had to the accompanying drawing and descriptive matter in which there is illustrated a preferred embodiment of the invention.

BRIEF DESCRIPTION OF THE DRAWING

The only FIGURE of the drawing is a transverse sectional view of a substrate coated with a coating in accordance with the method of the invention.

DESCRIPTION OF THE PREFERRED EMBODIMENT

In accordance with the method of the invention, a light transmitting, absorbing coating is produced on a substrate 10, using a conventional cathode sputtering device which is equipped with a target changer. The coating comprises alternate metal and non-metal layers on the substrate 10, comprising $SiO_2$ layers and chrome layers which are deposited alternately on the substrate 10. The substrate is advantageously a transparent material, such as glass or plastic. In the drawing, only four layers are indicated, but 18 layers are advantageously applied, of which advantageously the layer adjacent the substrate and all alternate layers are $SiO_2$ layers.

The $SiO_2$ layers are produced by sputtering silicon in an oxidizing atmosphere which includes an argon-oxygen mixture and at a total pressure of $8 \times 10^{-4}$ torr, and a partial oxygen pressure of $2 \times 10^{-4}$ torr. The thickness of each $SiO_2$ layer is 40 nm and a preferred construction is with a $SiO_2$ layer of at least 30 nm.

The chrome layers are obtained by sputtering metallic chrome in pure argon at a pressure of $8 \times 10^{-4}$ torr, with the individual chrome layers being deposited in different thicknesses, in accordance with the following Table 1. By means of layer thicknesses thus stepped, the reflection of the finished coating can be adjusted to a minimum which is desirable in many applications. To obtain coatings transmitting bluish light, it is not necessary to use chrome layers of different thicknesses.

TABLE 1

| Layer No. | 1 | 2 | 3 | 4 | 5 | 6 | 7 | 8 | 9 |
|---|---|---|---|---|---|---|---|---|---|
| Thickness in nm | 40 | 0,25 | 40 | 0,50 | 40 | 0,9 | 40 | 1,6 | 40 |
| Layer No. | 10 | 11 | 12 | 13 | 14 | 15 | 16 | 17 | 18 |
| Thickness in nm | 2,7 | 40 | 1,6 | 40 | 0,9 | 40 | 0,5 | 40 | 0,25 |

The coating, in accordance with the invention, may be combined with other layers. In particular, coatings transmitting green light may be obtained by combining an inventive partial coating of blue transparency with further layers of brownish-yellow transmission color. Numerous layer substances having a brownish-yellow transmission color are known. The following Table 2 indicates such a combined coating where, aside from SiO$_2$ and chrome layers, copper layers have also been deposited:

TABLE 2

| Layer No. | 1 | 2 | 3 | 4 | 5 | 6 | 7 | 8 | 9 |
|---|---|---|---|---|---|---|---|---|---|
| SiO$_2$ (nm) | 43 | | 43 | | 43 | | 43 | | 43 |
| Copper (nm) | | 0,5 | | 0,65 | | 0,8 | | 1,1 | |
| Layer No. | 10 | 11 | 12 | 13 | 14 | 15 | 16 | 17 | |
| SiO$_2$ (nm) | | 43 | | 43 | | 43 | | 43 | |
| Copper (nm) | 1,3 | | 1,6 | | 1,6 | | 1,6 | | |
| Layer No. | 18 | 19 | 20 | 21 | 22 | 23 | 24 | 25 | |
| SiO$_2$ (nm) | | 43 | | 43 | | 43 | | 43 | |
| Chrome (nm) | 1,6 | | 1,6 | | 1,3 | 1,1 | | | |
| Layer No. | 26 | 27 | 28 | 29 | 30 | 31 | | | |
| SiO$_2$ (nm) | | 43 | | 43 | | 43 | | | |
| Chrome (nm) | 0,8 | | 0,65 | | 0,5 | | | | |

The inventive coatings of bluish transmission color are also obtained in cases where chrome is mixed with neutral layer substances. Such a neutral layer substance which may be admixed to chrome for depositing the layer is, for example, nickel.

In all cases, however, it is important to evaporate chrome in a non-oxidizing residual gas atmosphere. Oxide layers and other compounds capable of releasing oxygen cannot be used as neutral substances in general since, in most cases, they tend to give off oxygen to the chrome.

While a specific embodiment of the invention has been shown and described in detail to illustrate the application of the principles of the invention, it will be understood that the invention may be embodied otherwise without departing from such principles.

What is claimed is:

1. A light transmitting filter having a blue-gray transmission color, in particular a sight glass, comprising a substrate of a transparent material and a coating on said substrate of alternate metal and non-metal layers, said metal layers consisting essentially of chromium and having a thickness of less than 10 nm, and said non-metal layers consisting essentially of silicon dioxide.

2. A light transmitting, absorbing coating, according to claim 1, wherein said silicon dioxide layers are at least 30 nm.

3. A light transmitting, absorbing coating, according to claim 1, wherein the coating comprises at least five individual chrome layers.

4. A light transmitting, absorbing coating, according to claim 1, wherein there are 18 layers and the coating has a bluish-grey transmission color.

5. A light transmitting, absorbing coating, according to claim 4, including a further layer of copper to form a green light transmission color.

6. A light transmitting, absorbing coating, according to claim 1, including a further coating of nickel wherein the coating provides a bluish-grey transmission color.

7. A light-transmitting filter, according to claim 1, wherein a non-metal silicone dioxide is adjacent to said substrate.

8. A light-transmitting filter, according to claim 1, wherein said substrate comprises a transparent plastic material.

9. A light-transmitting filter, according to claim 1, wherein said substrate comprises a vitreous material.

* * * * *